(12) United States Patent
Telefus et al.

(10) Patent No.: US 10,469,077 B2
(45) Date of Patent: Nov. 5, 2019

(54) ELECTRONIC SWITCH AND DIMMER

(71) Applicant: INTELESOL, LLC, Danville, CA (US)

(72) Inventors: Mark Telefus, Orinda, CA (US);
Bradley Larson, Sunnyvale, CA (US);
Harry Rodriguez, Gilroy, CA (US)

(*) Notice: Subject to any disclaimer, the term of this patent is extended or adjusted under 35 U.S.C. 154(b) by 0 days.

(21) Appl. No.: 16/092,839

(22) PCT Filed: May 1, 2017

(86) PCT No.: PCT/US2017/030415
§ 371 (c)(1),
(2) Date: Oct. 11, 2018

(87) PCT Pub. No.: WO2017/196572
PCT Pub. Date: Nov. 16, 2017

(65) Prior Publication Data
US 2019/0140640 A1 May 9, 2019

Related U.S. Application Data

(60) Provisional application No. 62/431,926, filed on Dec. 9, 2016, provisional application No. 62/335,495, filed on May 12, 2016.

(51) Int. Cl.
*H03K 17/785* (2006.01)
*G05F 1/45* (2006.01)
*H02M 5/293* (2006.01)
*H05B 33/08* (2006.01)
*H02J 7/02* (2016.01)

(52) U.S. Cl.
CPC .............. *H03K 17/785* (2013.01); *G05F 1/45* (2013.01); *H02M 5/293* (2013.01); *H05B 33/0815* (2013.01); *H05B 33/0845* (2013.01); *H02J 7/025* (2013.01); *H03K 2217/0009* (2013.01)

(58) Field of Classification Search
CPC ... H03K 2217/0009; H03K 2217/0054; H03K 17/6874; H03K 17/785; H03K 17/567; H03K 17/74; H03K 17/04106; H03K 17/687; H01L 2224/48137
See application file for complete search history.

(56) References Cited

U.S. PATENT DOCUMENTS

| | | |
|---|---|---|
| 4,074,345 A | 2/1978 | Ackermann |
| 4,127,895 A | 11/1978 | Krueger |
| 4,487,458 A * | 12/1984 | Janutka ............... H03K 17/102 327/432 |
| 4,760,293 A | 7/1988 | hebenstreit |
| 5,654,880 A | 8/1997 | Brkovic et al. |
| 5,731,732 A | 3/1998 | williams |
| 6,111,494 A | 8/2000 | Fischer |

(Continued)

*Primary Examiner* — Tung X Le
*Assistant Examiner* — Borna Alaeddini
(74) *Attorney, Agent, or Firm* — Mark Wisnosky

(57) ABSTRACT

A novel approach for the control of AC power uses power MOSFETs in a bidirectional switch subcircuit configuration having an optically coupled, electrically floating control circuit that self-biases the switches into the "on" state and uses an optically coupled control element to force the switches into the "off state. The time constant of the control circuit is fast enough to allow phase control as well as on-off control. A plurality of subcircuits can be easily cascaded to provide improved performance.

20 Claims, 7 Drawing Sheets

(56) References Cited

U.S. PATENT DOCUMENTS

| | | | |
|---|---|---|---|
| 6,169,391 B1 | 1/2001 | Lei | |
| 6,538,906 B1 | 3/2003 | Ke et al. | |
| 7,297,603 B2 * | 11/2007 | Robb | H01L 29/086 |
| | | | 438/289 |
| 7,729,147 B1 | 6/2010 | Wong et al. | |
| 7,746,677 B2 | 6/2010 | Unkrich | |
| 9,287,792 B2 | 3/2016 | Telefus et al. | |
| 9,443,845 B1 * | 9/2016 | Stafanov | H01L 29/407 |
| 9,621,053 B1 | 4/2017 | Telefus | |
| 2005/0162139 A1 * | 7/2005 | Hirst | H03K 17/6874 |
| | | | 323/239 |
| 2007/0008747 A1 * | 1/2007 | Soldano | H02M 7/217 |
| | | | 363/21.04 |
| 2010/0155369 A1 | 6/2010 | Kularatna et al. | |
| 2010/0244730 A1 * | 9/2010 | Nerone | H05B 41/36 |
| | | | 315/294 |
| 2010/0320840 A1 | 12/2010 | Fridberg | |
| 2011/0292703 A1 | 12/2011 | Cuk | |
| 2014/0085940 A1 | 3/2014 | Lee et al. | |
| 2015/0097430 A1 * | 4/2015 | Scruggs | B60R 16/033 |
| | | | 307/23 |
| 2015/0180469 A1 * | 6/2015 | Kim | H03K 17/687 |
| | | | 327/537 |
| 2016/0247799 A1 * | 8/2016 | Stafanov | H01L 29/407 |
| 2017/0338809 A1 * | 11/2017 | Stefanov | H01L 27/0727 |

* cited by examiner

ELECTRONIC SWITCH AND DIMMER

CROSS-REFERENCE TO RELATED APPLICATIONS

This application claims priority to U.S. Provisional Patent Application 62/335,495, Titled: AC Direct LVO Electronic Dimming Switch, Filed May 12, 2016 and U.S. Provisional Patent Application 62/431,926, Titled: Electronic Switch and Dimmer, Filed Dec. 9, 2016, both including common inventors.

STATEMENT REGARDING FEDERALLY SPONSORED RESEARCH OR DEVELOPMENT

Not Applicable.

BACKGROUND OF THE INVENTION

Technical Field

The invention relates to a power management system and methods to provide an electronic switch and dimming control.

RELATED BACKGROUND ART

Traditional access to alternating current (AC) electrical power in home and business environments is provided by mechanical outlets that are wired into the facility electrical system. These outlets are protected from excessive electrical loads or potentially dangerous ground faults using electromechanical devices such as fuses and circuit breakers. Similarly, the control of conventional electrical room appliances such as lighting and ceiling fans occurs using electromechanical switches. These fundamentally mechanical control devices provide simple on-off control and inevitably wear out and, over time, can cause short circuits or potentially dangerous arcing.

More nuanced control of common electrical appliances is typically provided by electronic devices such as triacs which allow the AC mains waveform to be interrupted on a cycle-by-cycle basis, so-called phase control. Although significantly more efficient than the rheostats or autotransformers that preceded them, triacs are still too inefficient to be used effectively in small enclosures for the control of large electrical loads and can induce electrical noise back into the facility electrical system.

Thus, there is a need for an improved electronic control system that provides a wider range of more reliable and highly efficient control options for broad application in facility electrical systems. Furthermore, there is a need for such a control system that can be realized using semiconductor devices that can be integrated with other circuitry for advanced power control functions that can be manufactured at low cost.

BRIEF SUMMARY OF THE INVENTION

The present invention relates to a novel approach for the control of AC power throughout a facility electrical system ranging from simple outlet on-off switching to continuous variation of the applied AC power for, for example, the dimming of electrical lights. More particularly the invention relates to a combination of functions that provides in one embodiment both on-off and phase-control of the AC mains waveform. One embodiment uses power MOS field-effect transistors (MOSFETs) as electronic switches having very low "on" resistance connected between the AC mains supply and the desired load. Since typical power MOSFETs intrinsically incorporate a body diode in parallel with the conducting channel, pairs of devices are connected in a back-to-back arrangement having the source terminals in common to provide a truly bidirectional (AC) switch configuration. In order to control the switching action of the power MOSFETs a novel floating control circuit is employed that uses rectifying diodes connected at the drains to precharge the gate-source bias voltage thereby turning both devices "on", and an optically coupled phototransistor that shorts the gate terminals to the common source terminal to force the devices into their "off" state when illuminated by an isolated optical source. Thus, the power MOSFET switches are normally "on" unless forced "off" by the optical control signal. The optical control signal can be applied continuously for nominal on-off control of the power delivered to the load, or it can be synchronized with the AC mains waveform to provide phase control. Integrated control circuitry for the optical control signal can provide either leading edge phase control preferred for switching reactive loads or trailing edge phase control preferred for nonlinear loads such as LEDs. The specific examples are not intended to limit the inventive concept to the example application. Other aspects and advantages of the invention will be apparent from the accompanying drawings and detailed description.

DETAILED DESCRIPTION OF THE INVENTION

Figure 1:
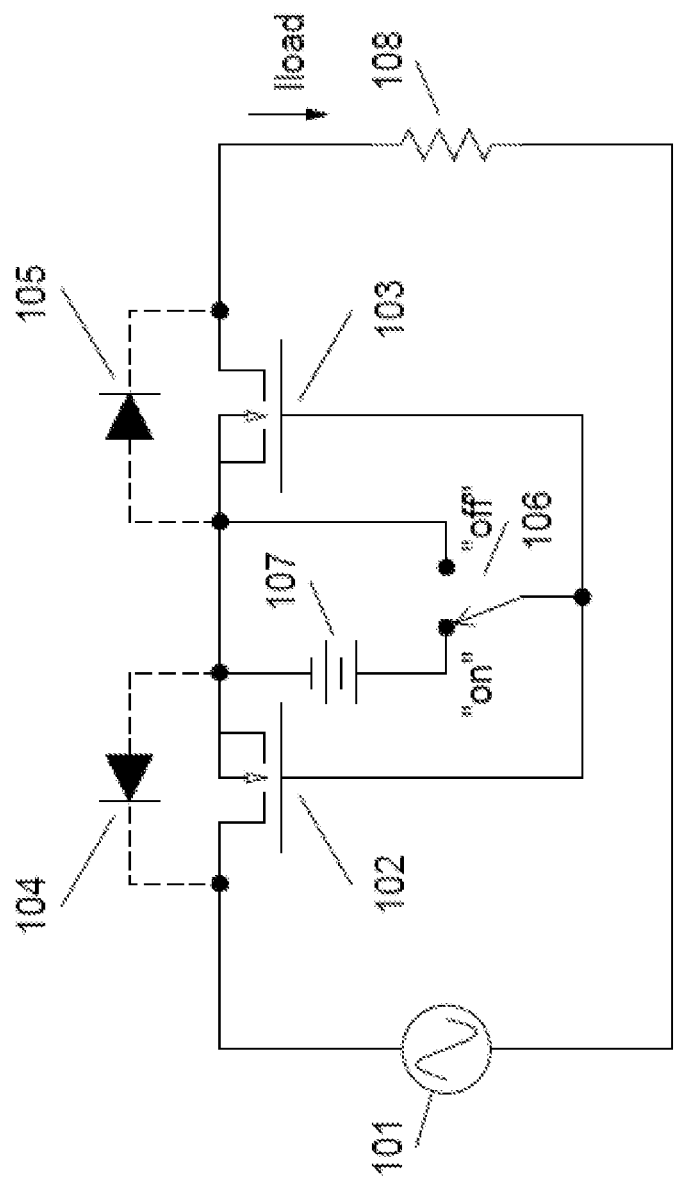
FIG. 1 is a schematic diagram of the basic power MOSFET bidirectional switch unit.

FIG. 1 is a schematic diagram showing the basic power MOSFET bidirectional switch controlling the power delivered from AC source 101 to load 108. Power MOSFETs 102 and 103 include body diodes 104 and 105, respectively. Switch 106 controls the gate-to-source bias voltage applied to power MOSFETs 102 and 103. In the "on" position bias voltage 107 is applied to the gate terminals of the power MOSFETs. Voltage 107 is a voltage greater than the threshold voltage of the power MOSFETs (typically 5 to 10 volts) causing an inversion layer to form thereby creating a conducting channel extending from the drain to the source of each device. In this "on" state, the drain-to-source behavior of each power MOSFET can be modeled as a low value resistor, $R_{ds}$. As long as the voltage drop between drain and source remains below about 0.6 volt, the body diodes remain nonconductive and can be neglected. In the "on" state the circuit of FIG. 1 is equivalently the load 108 connected to AC source 101 through a series resistor having value $2R_{ds}$.

In the "off" position of switch 106 the gate terminals of the power MOSFETs are shorted to the source terminals and the drain-to-source conducting channels vanish as long as the drain-to-source voltage remains below the breakdown voltage of the body diodes. In the "off" state the circuit of FIG. 1 is equivalently the load 108 connected to AC source 101 through back-to-back body diodes 104 and 105, which effectively disconnects the load 108 from source 101.

The requirement that the drain-to-source voltage of the power MOSFETs remain below the breakdown voltage of the body diodes, $V_{br}$, in the "off" state requires that the breakdown voltage of the body diodes exceed the peak voltage of AC source 101. Thus, for example, assuming that source 101 corresponds to a common 120 volt (rms) AC mains, then the breakdown voltage of each body diode must exceed the peak source voltage of 170 volts.

A more detailed analysis of the power MOSFET structure shows that the body diode is effectively the base-collector junction of a bipolar transistor connected in parallel with the MOSFET channel. Additional parasitic elements include the capacitance of the base-collector junction and a parasitic resistance between the base and the emitter. This AC-coupled circuit places a constraint on the rate of change of the drain-to-source voltage, $dV_{ds}/dt$, to avoid forward biasing the base-emitter junction, thereby causing the bipolar transistor to conduct while the MOSFET channel is "off". While the resulting leakage current may not be sufficient to energize the load 108, it may be large enough to cause additional efficiency or safety concerns.

Similarly, consideration of the constraints in the "on" state require that the drain-to-source voltage drop for each power MOSFET given by $R_{ds}*Iload$ be less than about 0.6 volts. Potentially more important is the power dissipated in each power MOSFET in the "on" state given by $R_{ds}*Iload^2$ which must remain less than a few watts to avoid excessive temperature rise. Thus, for example, switching a common household circuit from a 120 volt AC mains having a typical limit of 20 amperes requires that $R_{ds}$ for each power MOSFET be less than 0.005 ohms (5 milliohms.)

It is well known in the art that the breakdown voltage of the body diode can be advantageously traded off against the value of $R_{ds}$ by varying the structure and the doping levels in the device. In particular, it has been shown that the value of $R_{ds}$ is proportional to $V_{br}^{2.5}$. Thus, for example, cutting $V_{br}$ in half results in reducing $R_{ds}$ by a factor of 5.7. The circuit of FIG. 1 shows that the conceptual bias switching circuit comprising switch 106 and voltage source 107 floats electrically with the common source terminals of the back-to-back power MOSFETs 102 and 103 which vary across the entire peak-to-peak range of source 101. Although simple in concept, this circuit can be difficult to realize in practice at low cost.

Figure 2:
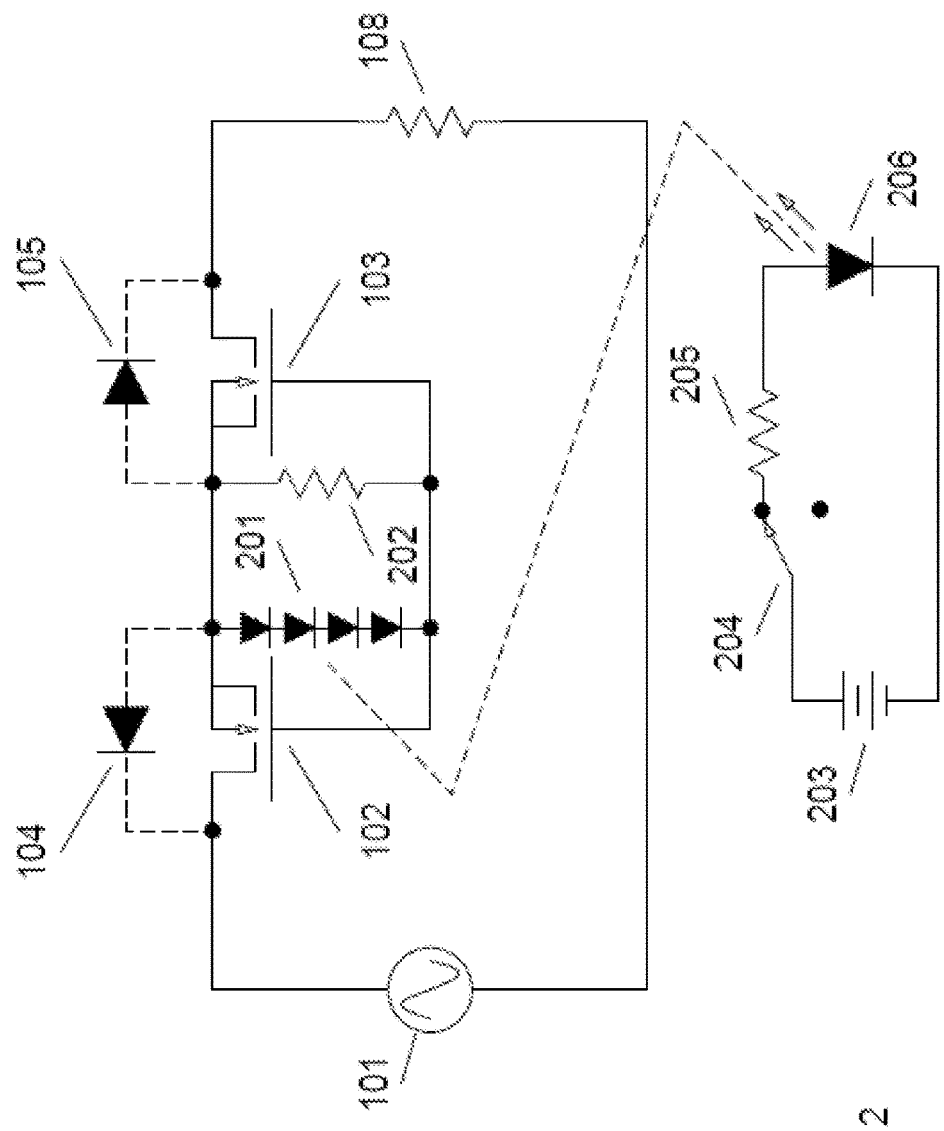
FIG. 2 is a schematic diagram of a prior art bidirectional switch using optoelectronic bias generation.

FIG. 2 shows a schematic diagram of a prior art approach to the control circuit.

Voltage source 106 in FIG. 1 is replaced with a photovoltaic diode stack 201 that provides the needed gate-to-source bias voltage when illuminated by a light emitting diode (LED) 206 which is powered by a separate low voltage source 203 and controlled by switch 204 through current limiting resistor 205. Elements 203-206 are assumed to be within optical proximity of diode stack 201. When LED 206 is switched off, the voltage across diode stack 201 is drained through resistor 202 and the power MOSFETs enter the "off" state.

Although the circuit of FIG. 2 works for simple on-off switching applications, the time constants associated with charging and discharging the gate-to-source capacitance of the power MOSFETs through the bias circuitry are typically too large to effect phase control in 50/60 Hz AC mains.

Figure 3:
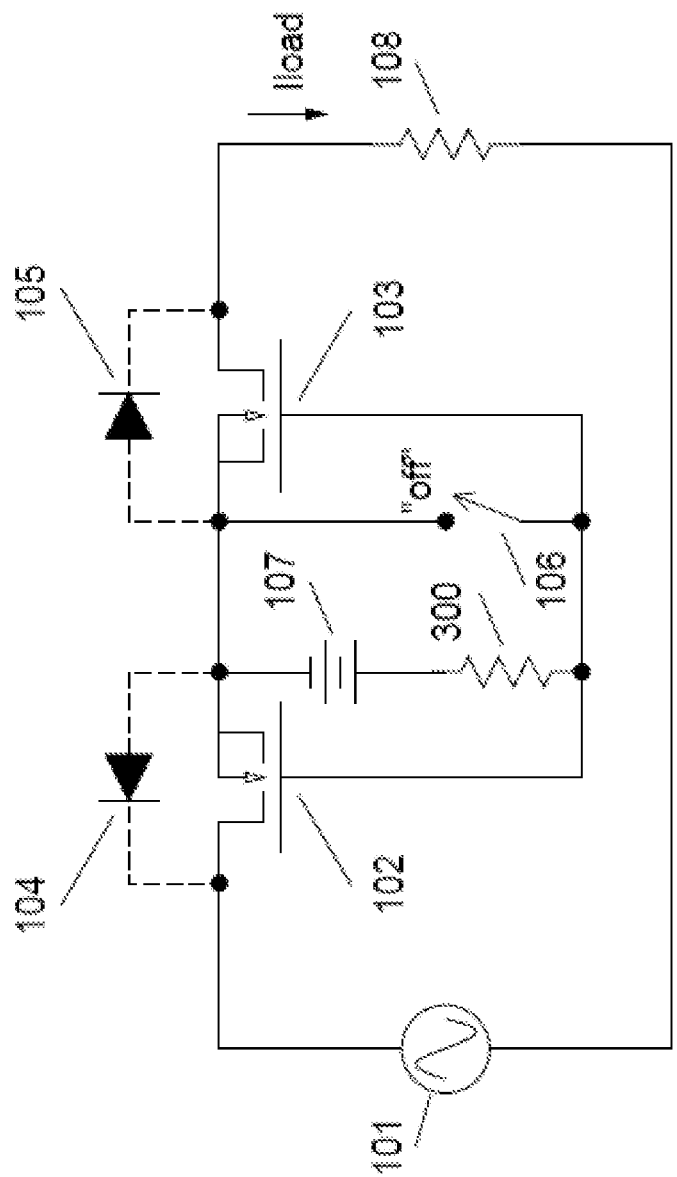
FIG. 3 is a schematic diagram of the basic elements of the improved bidirectional switch.

FIG. 3 is a schematic diagram showing the basic elements of the improved switch circuit. Although power MOSFETs are the preferred embodiment switching devices discussed in the following description, it will be apparent to one skilled in the art that other types of field-effect transistors can be advantageously employed in the improved circuit. As in FIG. 1, voltage 107 is used to bias power MOSFETs 102 and 103 into their "on" state. Opposite to the operation of the circuit in FIG. 1, the power MOSFETs are "on" only as long as switch 106 remains open. When switch 106 is closed the power MOSFETs are forced to enter their "off" state since their gates and sources are shorted together and voltage 107 is dropped across resistor 300.

Figure 4:
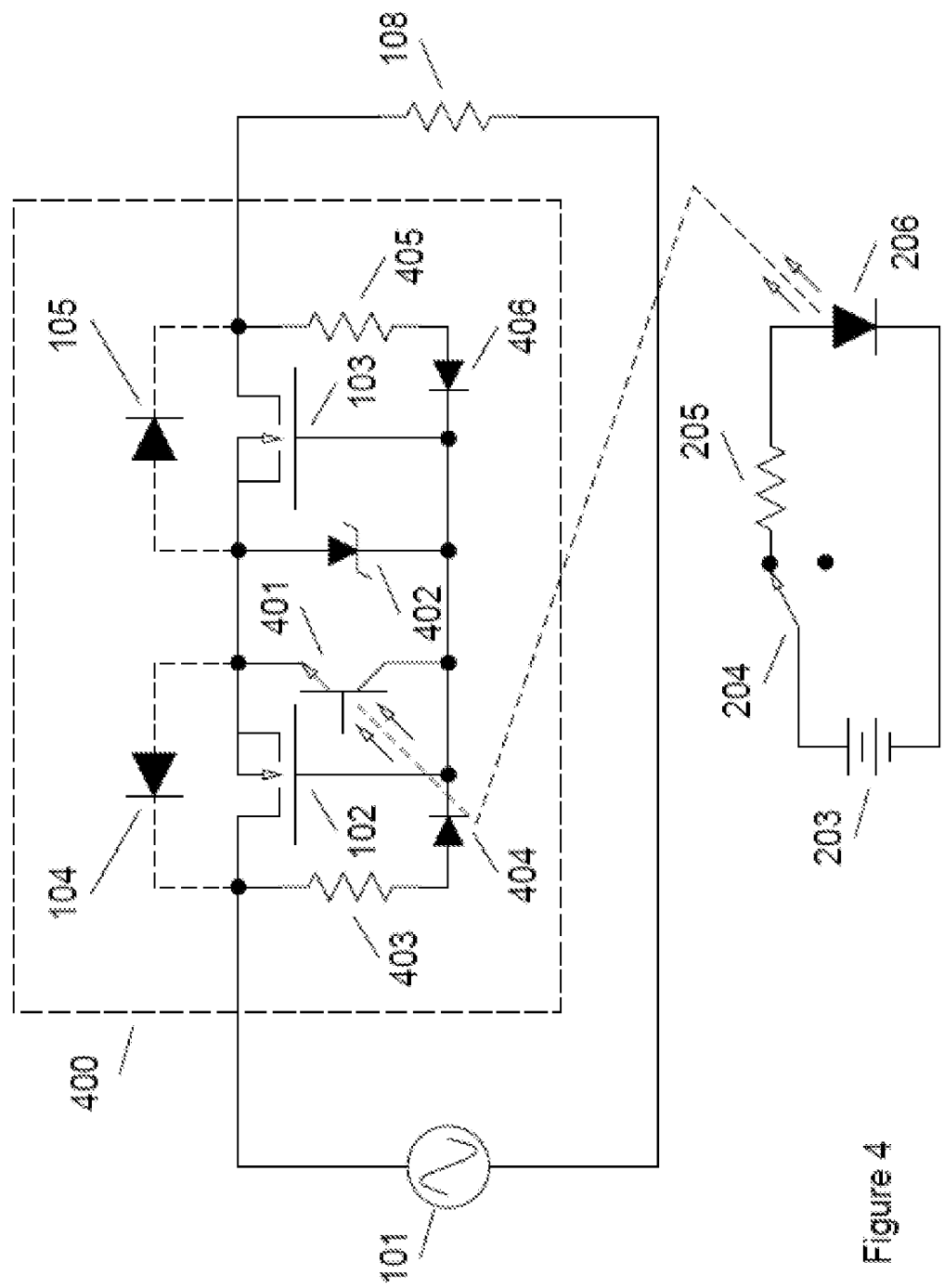
FIG. 4 is a schematic diagram of an embodiment of the improved bidirectional switch.

FIG. 4 is a schematic diagram showing an embodiment of the inventive circuit. Voltage source 106 in FIG. 1 is replaced in switching unit 400 with a Zener diode 402 having a Zener voltage greater than the threshold voltage of the power MOSFETs. Zener diode 402 is biased through rectifier diodes 404 and 406 connected at the drain terminals of the power MOSFETs and protected by current limiting resistors 403 and 405, respectively. Thus, in the absence of illumination resistor-diode branches 403-404 and 405-406 provide bias for Zener diode 402 when either of the drain terminals exceeds the Zener voltage, placing power MOSFETs 102 and 103 in the "on" state. When illuminated by LED 206 phototransistor 401 shunts the bias current from branches 403-404 and 405-406 to the source terminals of the power MOSFETS placing them in the "off" state. In this circuit the turn-on time constant is dictated by the value of the current limiting resistors 403 and 405 and the gate-to-source capacitance of the power MOSFETs, while the turn-off time constant is dictated by the saturation current of the phototransistor 401 at the illumination level provided by LED 206. Both of these time constants can be designed to be much shorter than the period of the AC mains, thereby allowing this embodiment to operate in both an on-off and a phase-control mode.

Figure 5:
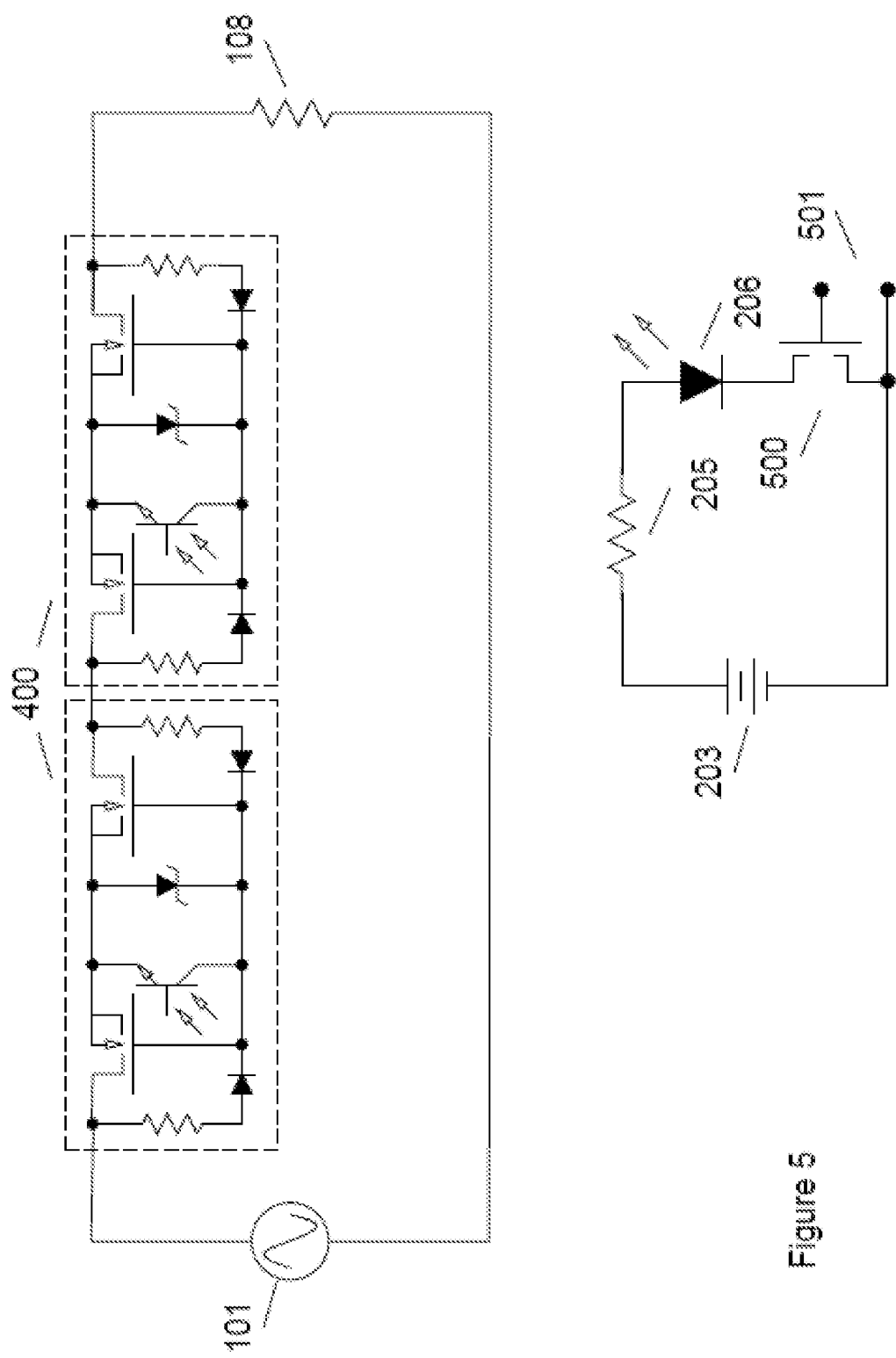
FIG. 5 is a schematic diagram of the embodiment of FIG. 3 using two switching elements to reduce total switch "on" resistance and increase total switch "off" resistance.

FIG. 5 is a schematic diagram of the embodiment of FIG. 4 using two switch units 400 to improve the performance of the circuit. In this embodiment it is assumed that the power MOSFETs are selected to have half the breakdown voltage of the units used in FIG. 4. Thus, the on resistance of the individual switch units can be expected to be reduced by a factor of 5.7, as described above, and the total on resistance of the two switch units connected in series is reduced by a factor of 2.8 relative to the circuit in FIG. 4. Additionally, the voltage drop across each of the switch units in the "off" state is halved, thereby reducing the $dV_{ds}/dt$ experienced by each unit by a factor of two and consequently reducing the "off" state leakage current.

FIG. 5 also includes an electronic switch circuit to control the illumination of LED 206. The current through LED 206 from voltage source 203 is limited by resistor 205 and is controlled by transistor 500. Transistor 500 is controlled by an external control voltage applied to control terminals 501. This allows for the rapid switching of the LED in synchronism with the AC mains waveform through external control circuitry (not shown) to provide phase control of the applied AC waveform, as is used in dimmer applications. In another embodiment the control signal is a train of pulses synchronized with the AC mains waveform and having adjustable pulse widths to effectively control the average current/power delivered to the load, thereby providing a dimming effect for a light source load and a speed control for an AC motor load. In another embodiment the control signal is a train of pulses having a fixed or variable frequency independent of the AC mains waveform thereby generating a radio-frequency (RF) power waveform at the load terminals for use as a wireless charger/generator. In another embodiment the control signal is a variable DC voltage allowing variable illumination of the LED thereby allowing the MOSFETs to operate in a linear mode.

Figure 6:
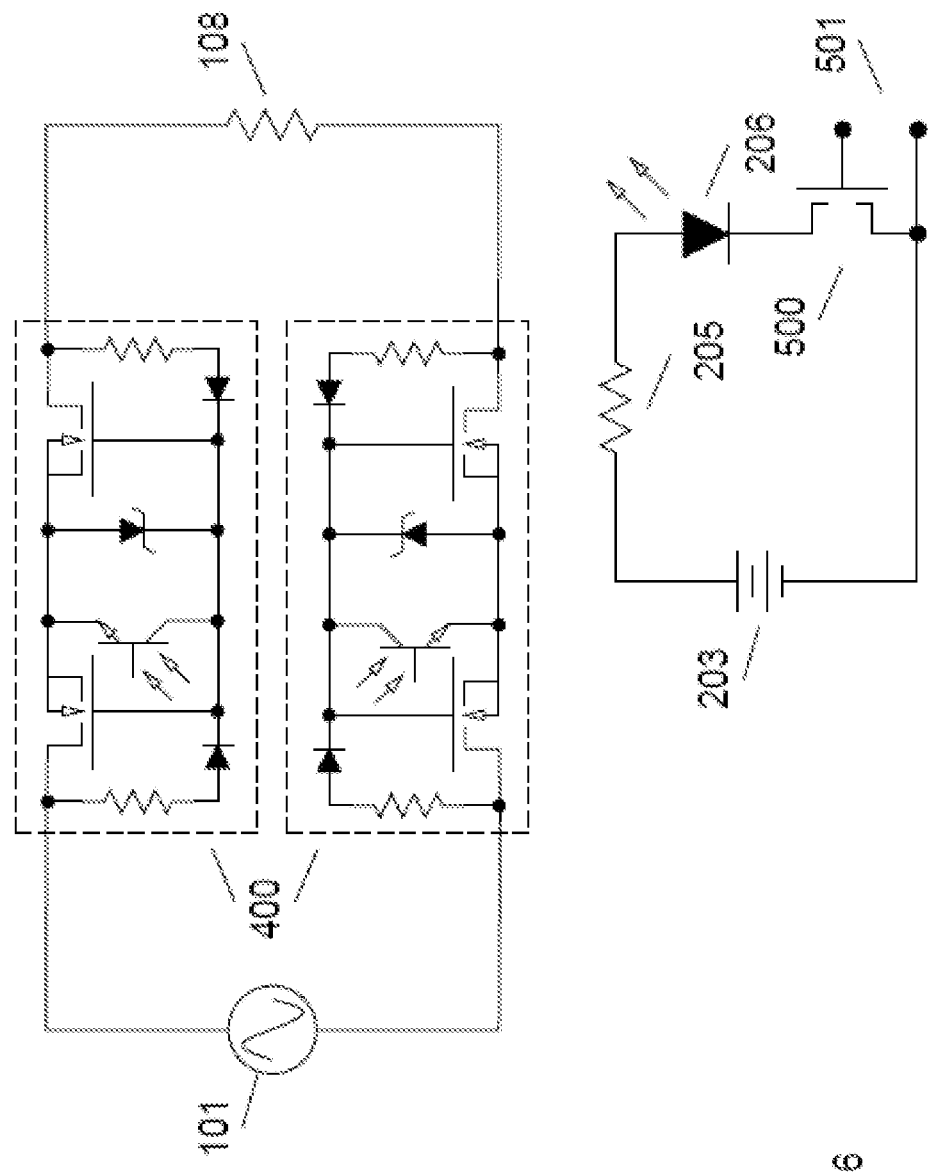
FIG. 6 is a schematic diagram of an embodiment similar to that of FIG. 3, but with the switching elements in both arms of the AC power supply.

FIG. 6 is a schematic diagram of an embodiment similar to that of FIG. 5, but with an individual switch unit 400 placed in each arm of the AC power supply. The inventor has found that this circuit configuration further improves the turn-off characteristics of the switch devices, further reducing leakage currents.

Figure 7:
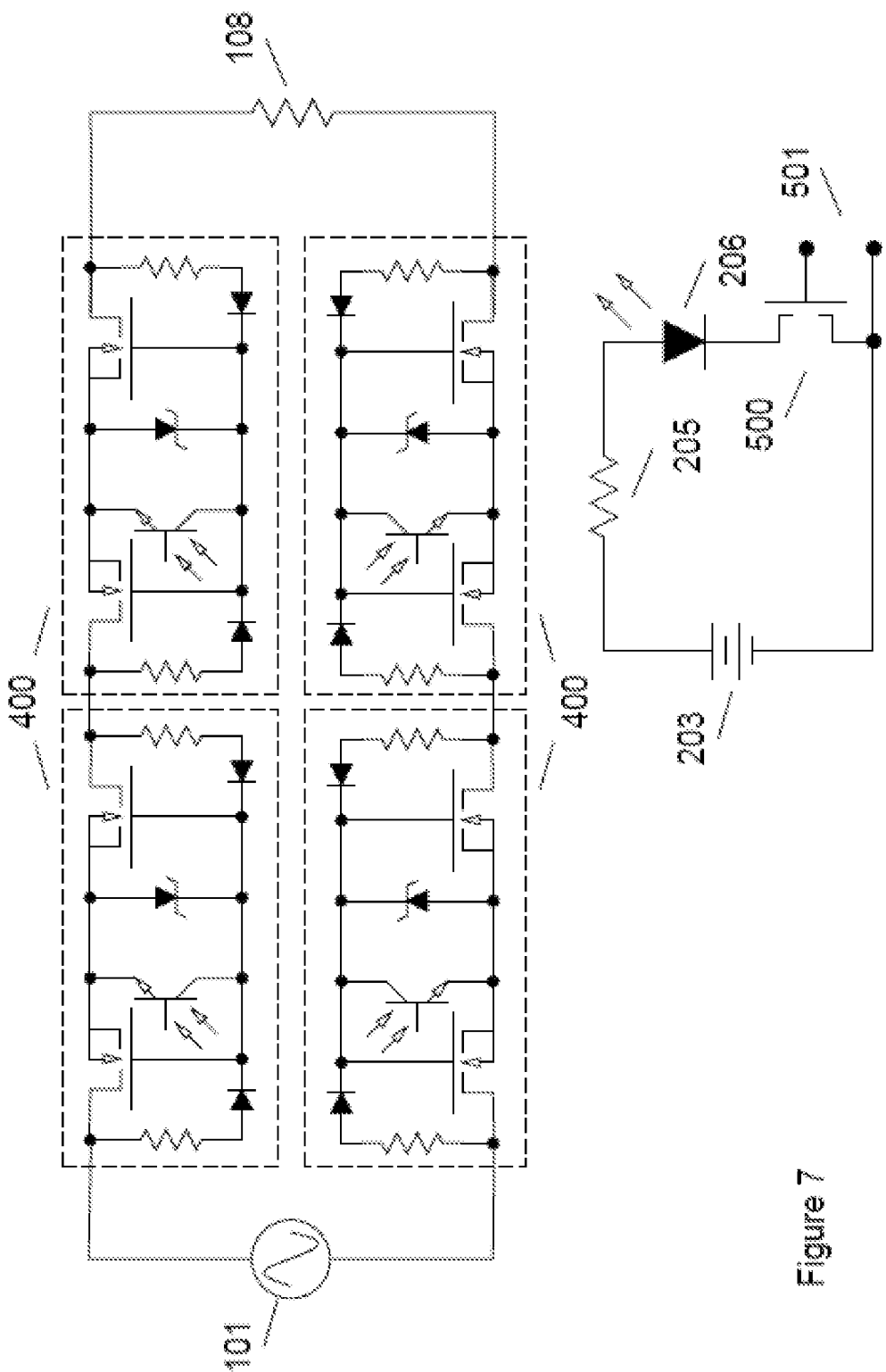
FIG. 7 is a schematic diagram of the embodiment of FIG. 5 using four switching elements to further reduce total switch "on" resistance and further increase total switch "off" resistance.

FIG. 7 is a schematic diagram of the embodiment of FIG. 6 using two switch units 400 in each arm of the AC supply to further improve the performance of the circuit. In this embodiment it is assumed that the power MOSFETs are selected to have one-fourth the breakdown voltage of the units used in FIG. 3. Thus, the on resistance of the individual switch units can be expected to be reduced by a factor of 32, as described above, and the total on resistance of the two switch units connected in series is reduced by a factor of 8 relative to the circuit in FIG. 4. Additionally, the voltage drop across each of the switch units in the "off" state is quartered, thereby reducing the $dV_{ds}/dt$ experienced by each unit by a factor of four and consequently further reducing the "off" state leakage current relative to the circuit in FIG. 4. As mentioned above, the inventor has found that this circuit configuration further improves the turn-off characteristics of the switch devices, further reducing leakage currents.

SUMMARY

A novel approach for the control of AC power throughout a facility electrical system is described. The approach uses power MOSFETs in a bidirectional switch subcircuit configuration having an optically coupled, electrically floating control circuit that self-biases the switches into the "on" state and uses an optically coupled control element to force the switches into the "off" state. The time constant of the control circuit is fast enough to allow phase control as well as on-off control. A plurality of subcircuits can be easily cascaded to provide improved performance.

What is claimed is:

1. A bidirectional electronic switch circuit having an input terminal and an output terminal and further comprising:
   a. first and second series connected electronic switch devices, each switch device having a drain terminal, a source terminal and a gate terminal and being characterized by a threshold voltage specified between the gate terminal and the source terminal, wherein the drain terminal of the first switch device comprises the input terminal of the switch circuit and drain terminal of the second switch devices comprise the output terminal of the switch circuit, the source terminals of the first and second switch devices are interconnected at a first control terminal and the gate terminals of the first and second switch devices are interconnected at a second control terminal;
   b. a voltage source having a voltage that exceeds the switch device threshold voltage and applied across the first and second switch device control terminals through a current limiting resistor, wherein the voltage source comprises:
      a. a first rectifier device connected from the input terminal of the switch circuit to the second switch device control terminal, and,
      b. a second rectifier device connected from the output terminal of the switch circuit to the second switch device control terminal, and,
      c. a voltage regulator device connected from the first switch device control terminal to the second switch device control terminal, and,
   c. a switch connected across the first and second device control terminals.

2. The bidirectional electronic switch circuit of claim 1 wherein the switch comprises:
   a. a photo-activated electronic device characterized by a conductance proportional to the intensity of illumination incident upon the photo-activated electronic device and connected from the first switch device control terminal to the second switch device control terminal, and,
   b. a light emitting device connected to a first and a second bidirectional electronic switch control terminals, and, arranged to illuminate the photo-activated electronic device wherein the intensity of the light emitted by the light emitting device is proportional to an amplitude of an external control signal applied to the first and second bidirectional electronic switch control terminals.

3. The bidirectional switch circuit of claim 2 wherein the photo-activated device comprises a semiconductor phototransistor having a collector terminal and an emitter terminal, wherein the emitter terminal is connected to the common source terminal of the switch devices and the collector terminal is connected to the common gate terminal of the switch devices.

4. The bidirectional switch circuit of claim 2 wherein the light emitting device comprises a semiconductor light-emitting diode having an anode terminal and a cathode terminal, wherein the anode terminal is connected to the first bidirectional electronic switch control terminal and the cathode terminal is connected to the second bidirectional electronic switch control terminal.

5. A method of using the bidirectional electronic switch circuit of claim 2 to couple AC power to a load device comprising:
   a. first and second power input terminals for receiving power from an AC source;
   b. first and second power output terminals for providing AC power to the load device;
   c. connecting the input terminal of said bidirectional electronic switch circuit to the first power input terminal and the output terminal of said bidirectional electronic switch circuit to the first power output terminal;
   d. connecting the second power input terminal to the second power output terminal; and
   e. providing an electronic control signal to the first and second control terminals of the bidirectional electronic switch circuit.

6. The method of claim 5 wherein the control signal applied to the first and second control terminals of the bidirectional electronic switch circuit is pulsed in synchronism with the AC power source to provide phase control of the AC power coupled to the load.

7. A method of using the bidirectional electronic switch circuit of claim 2 to couple AC power to a load device comprising:

a. first and second power input terminals for receiving power from an AC source;
b. first and second power output terminals for providing AC power to the load device;
c. first and second bidirectional electronic switch circuits;
d. connecting the input terminal of said first bidirectional electronic switch circuit to the first power input terminal and the output terminal of said first bidirectional electronic switch circuit to the first power output terminal;
e. connecting the input terminal of said second bidirectional electronic switch circuit to the second power input terminal and the output terminal of said second bidirectional electronic switch circuit to the second power output terminal; and
f. providing electronic control signals to the first and second control terminals of the first and second bidirectional electronic switch circuits.

8. The method of claim 7 wherein the control signal applied to the first and second control terminals of the bidirectional electronic switch circuit is pulsed in synchronism with the AC power source to provide phase control of the AC power coupled to the load.

9. A method of using the bidirectional electronic switch circuit of claim 2 to couple AC power to a load device comprising:
a. first and second power input terminals for receiving power from an AC source;
b. first and second power output terminals for providing AC power to the load device;
c. a circuit array comprising a plurality of bidirectional electronic switch circuits arranged in a series configuration wherein the input terminal of the first bidirectional electronic switch circuit is the input terminal of the circuit array and the input terminal of each succeeding bidirectional electronic switch is connected to the output terminal of the previous bidirectional electronic switch except that the output terminal of the last bidirectional electronic switch circuit is the output terminal of the circuit array, all of the first control terminals of the bidirectional electronic switch circuits are interconnected to form the first control terminal of the circuit array and all of the second control terminals of the bidirectional electronic switch circuits are interconnected to form the second control terminal of the circuit array;
d. connecting the input terminal of said bidirectional electronic switch circuit array to the first power input terminal and the output terminal of said bidirectional electronic switch circuit array to the first power output terminal;
e. connecting the second power input terminal to the second power output terminal; and
f. providing an electronic control signal to the first and second control terminals of the bidirectional electronic switch circuit array.

10. The method of claim 9 wherein the control signal applied to the first and second control terminals of the bidirectional electronic switch circuit is pulsed in synchronism with the AC power source to provide phase control of the AC power coupled to the load.

11. The method of using the bidirectional electronic switch circuit of claim 9 wherein the number of bidirectional electronic switch circuits in the circuit array is selected on the basis of the peak voltage of the AC power source.

12. A method of using the bidirectional electronic switch circuit of claim 2 to couple AC power to a load device comprising:
a. first and second power input terminals for receiving power from an AC source;
b. first and second power output terminals for providing AC power to the load device;
c. first and second circuit arrays each comprising a plurality of bidirectional electronic switch circuits arranged in a series configuration wherein the input terminal of the first bidirectional electronic switch circuit is the input terminal of the circuit array and the input terminal of each succeeding bidirectional electronic switch is connected to the output terminal of the previous bidirectional electronic switch except that the output terminal of the last bidirectional electronic switch circuit is the output terminal of the circuit array, all of the first control terminals of the bidirectional electronic switch circuits are interconnected to form the first control terminal of the circuit array and all of the second control terminals of the bidirectional electronic switch circuits are interconnected to form the second control terminal of the circuit array;
d. connecting the input terminal of said first bidirectional electronic switch circuit array to the first power input terminal and the output terminal of said first bidirectional electronic switch circuit array to the first power output terminal;
e. connecting the input terminal of said second bidirectional electronic switch circuit array to the second power input terminal and the output terminal of said second bidirectional electronic switch circuit array to the second power output terminal; and
f. providing an electronic control signal to the first and second control terminals of the bidirectional electronic switch circuit arrays.

13. The method of claim 12 wherein the control signal applied to the first and second control terminals of the bidirectional electronic switch circuit is pulsed in synchronism with the AC power source to provide phase control of the AC power coupled to the load.

14. The method of using the bidirectional electronic switch circuit of claim 12 wherein the number of bidirectional electronic switch circuits in the first and second circuit arrays is selected on the basis of the peak voltage of the AC power source.

15. The method of using the bidirectional electronic switch circuit of claim 12 wherein the control signal is a train of pulses synchronized with the AC mains waveform and having adjustable pulse widths to effectively control the average current/power delivered to the load, thereby providing a dimming effect for a light source load and a speed control for an AC motor load.

16. The method of using the bidirectional electronic switch circuit of claim 12 wherein the control signal is a train of pulses having a fixed or variable frequency independent of the AC mains waveform thereby generating a radio-frequency (RF) power waveform at the load terminals for use as a wireless charger/generator.

17. The method of using the bidirectional electronic switch circuit of claim 12 wherein the external control signal applied to the first and second bidirectional electronic switch control terminals is a variable DC voltage allowing variable illumination of the light-emitting device thereby allowing the electronic switch devices to operate in a linear mode.

18. The bidirectional electronic switch circuit of claim 1 wherein the first and second electronic switch devices are MOSFETs.

19. The bidirectional electronic switch circuit of claim 1 wherein the rectifier devices comprise first and second semiconductor diodes each having anode and cathode terminals, wherein the anode terminal of the first semiconductor diode is connected to the input terminal of the bidirectional switch circuit through a current-limiting resistor, the anode terminal of the second semiconductor diode is connected to the output terminal of the bidirectional switch circuit through a current-limiting resistor, and the cathode terminals of the first and the second semiconductor diodes are connected to the second switch device control terminal.

20. The bidirectional switch circuit of claim 1 wherein the voltage regulator device comprises a semiconductor Zener diode having an anode terminal and a cathode terminal, wherein the anode terminal is connected to the first control terminal, and the cathode terminal is connected to the second control terminal.

* * * * *